United States Patent [19]
Bockelman

[11] Patent Number: 5,751,153
[45] Date of Patent: May 12, 1998

[54] METHOD AND APPARATUS FOR CHARACTERIZING A MULTIPORT CIRCUIT

[75] Inventor: David E. Bockelman, Plantation, Fla.

[73] Assignee: Motorola, Inc., Schaumburg, Ill.

[21] Appl. No.: 642,236

[22] Filed: May 2, 1996

Related U.S. Application Data

[63] Continuation of Ser. No. 270,359, Jul. 5, 1994, Pat. No. 5,561,378.

[51] Int. Cl.$^6$ .................................................. G01R 27/28
[52] U.S. Cl. ........................... 324/638; 324/612; 324/615
[58] Field of Search ................................... 324/612, 613, 324/615, 620, 637, 638

[56] References Cited

U.S. PATENT DOCUMENTS

| | | | |
|---|---|---|---|
| 5,097,215 | 3/1992 | Eul et al. | 324/638 |
| 5,440,236 | 8/1995 | Schiek et al. | 324/638 |
| 5,442,296 | 8/1995 | Schiek et al. | 324/638 |
| 5,495,173 | 2/1996 | Bockelmen et al. | 324/625 |
| 5,608,330 | 3/1997 | Heuermann et al. | 324/638 |

*Primary Examiner*—Glenn W. Brown
*Attorney, Agent, or Firm*—Andrew S. Fuller

[57] ABSTRACT

An apparatus (310) for characterizing a multiport circuit (390) includes a signal generator (320) and a circuit interface apparatus (330, 340, 350). The signal generator (320) has an output (329) selectable from among a set of composite signals that are linearly independent. The circuit interface apparatus (330, 340, 350) is coupled to the signal generator (320) and has an output (319) of a set of circuit stimulus signals derived from the set of composite signals, which set of circuit stimulus signals are linearly independent, and which together form a complete basis for describing any response for the multiport circuit (390). The circuit interface apparatus (330, 340, 350) has measurement circuitry for measuring circuit response of the multiport circuit (390). Preferably, the circuit interface apparatus (330, 340, 350) is formed from multiple two-port test sets.

20 Claims, 5 Drawing Sheets

METHOD AND APPARATUS FOR CHARACTERIZING A MULTIPORT CIRCUIT

CROSS REFERENCE TO RELATED APPLICATIONS

This application is a continuing application of U.S. application Ser. No. 08/270,359, filed Jul. 5, 1994, by Bockelman, et al., entitled "CIRCUIT PROBE FOR MEASURING A DIFFERENTIAL CIRCUIT," and assigned to Motorola, Inc., now U.S. Pat. No. 5,561,378.

TECHNICAL FIELD

This invention relates in general to the measurement and characterization of multiport circuits.

BACKGROUND

It is often desirable to characterize the response of a particular circuit implementation. Generally, characterization involves the measurement of signals at various ports of a circuit. Two-port measurement systems are commercially available, and have been used in the characterization of circuits. In a typical application, a circuit is stimulated by introducing a signal into a particular port, and the circuit response determined by taking measurements at all ports. Circuits having more than two ports are difficult to accurately measure and characterize using a two-port measurement system. For example, compensation must be made, such as by the termination of particular ports, when a two-port measurement system is used to characterize a four-port circuit. Such compensation techniques may affect the accuracy of circuit response measurements, and consequently adversely impact the ability to fully characterize such a circuit. Conceptual measurement systems for three or more ports have been described in the literature, but the systems described are expensive to construct, and are not easily extendible. Thus, these systems are not generally commercially available.

It is desirable to measure and fully characterize circuit implementations having more than two ports without the accuracy degradation resulting from approximation methods typically required using a two-port measurement system. Preferably, such a measurement system would employ readily available components to avoid the high cost associated with proposed multiport systems, and would be easily extendible to circuits having four or more ports.

DETAILED DESCRIPTION OF THE PREFERRED EMBODIMENT

Generally, the present invention provides a method and apparatus for characterizing a multiport circuit. A measurement apparatus interfaces with the multiport circuit to provide stimulus signals, and to measure corresponding circuit response signals. The measurement apparatus includes multiple test sets that are coupled to a signal generator or source. The signal generator has an output selectable from among a set of composite signals that are linearly independent. A non-zero signal from each composite signal is coupled to each test set. Cumulatively, the test sets have interface ports that correspond to the ports of the circuit under test. The test sets couple a plurality of signal components derived from each composite signal, via the interface ports, to each port of the circuit, respectively. At least two of these signal components have non-zero values. The plurality of signal components together form a composite stimulus signal that is introduced into the circuit. The set of derived composite stimulus signals provide a complete basis for describing any response of the circuit. While introducing each composite stimulus signal, the circuit response is measured at each port of the circuit. Scattering parameters that characterize the circuit are then determined from the combination of measured circuit responses. In the preferred embodiment, the measurement system is formed from two-port test sets, such as are typically associated with two-port network analyzers.

Figure 1:
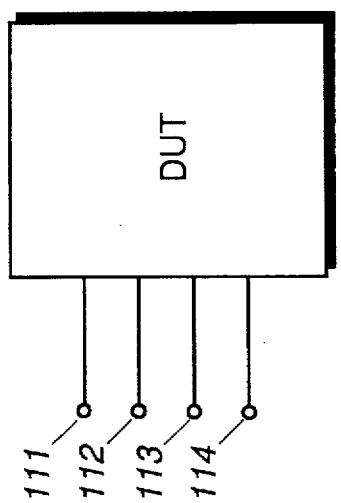
FIG. 1 is a block diagram of a multiport device under test (D.U.T.), in accordance with the present invention.

Referring now to FIG. 1, a block diagram of a multiport device under test (D.U.T.) 100 is shown, in accordance with the present invention. The D.U.T. 100 is a four-port circuit of the type which may be found in a radio frequency (RF) or microwave frequency application. Input/output ports 111, 112, 113, 114 on the D.U.T. 100 are used to inject or input stimulus signals, and to measure output signals from the D.U.T. The D.U.T. 100 may be a differential circuit supporting coupled pairs of input and output ports, or may be a four-port circuit supporting single ended signals. This four-port D.U.T. 100 provides a reference for the description of the present invention. However, the concepts embodied by the present invention are fully extendible to any multiport system, particularly, those involving three or more ports.

According to the present invention, a measurement system and associated method facilitate the measurement and characterization of multiport circuits. Scattering parameters (S-parameters) can be derived from measured circuit responses to known stimulus signals, and these S-parameters used to completely characterize the multiport circuit. The S-parameters may be defined as:

$$[b]=[S][a];$$

where [a] and [b] denote N-dimensional column vectors, and [S] denotes an N-by-N matrix. Additional information concerning S-parameters and associated measurement systems can be found in U.S. Pat. No. 5,495,173, issued to Bockelman, et al., on Feb. 27, 1996, for A METHOD AND APPARATUS FOR CHARACTERIZING A DIFFERENTIAL CIRCUIT, the entire contents of which are hereby incorporated by reference.

For a four-port application, generalized S-parameters can be represented in matrix form as:

$$\begin{bmatrix} b_1 \\ b_2 \\ b_3 \\ b_4 \end{bmatrix} = \begin{bmatrix} s_{11} & s_{12} & s_{13} & s_{14} \\ s_{21} & s_{22} & s_{23} & s_{24} \\ s_{31} & s_{32} & s_{33} & s_{34} \\ s_{41} & s_{42} & s_{43} & s_{44} \end{bmatrix} \begin{bmatrix} a_1 \\ a_2 \\ a_3 \\ a_4 \end{bmatrix}$$

Thus, for any four-port application, a vector of output signals can be related to a vector of input signals by a matrix of S-parameters.

In prior art applications, the S-parameter matrix would be developed by introducing a single stimulus signal into the D.U.T., and by measuring the circuit response at all ports. The S-parameters can be found using the calculations, $$s_{11} = \frac{b_1}{a_1}\bigg|_{a_2=a_3=a_4=0}; s_{21} = \frac{b_2}{a_1}\bigg|_{a_2=a_3=a_4=0}; s_{12} = \frac{b_1}{a_2}\bigg|_{a_1=a_3=a_4=0};$$

and so on. A total of sixteen S-parameters are calculated for a four-port circuit.

According to the present invention, an S-parameter matrix is developed by simultaneously stimulating at least two-ports of the circuit with non-zero signal components. Input stimulus signals can be represented by a vector having as many elements as there are ports. The vector has zero values representing ports at which no stimulus signal, i.e., a zero stimulus signal, is applied. A non-zero value is used when a non-zero stimulus signal is applied to a particular port. The vector is also referred to herein as a composite stimulus signal. A matrix of S-parameters completely characterizing the multiport circuit can be generated by successively stimulating the D.U.T. with signal components from a set of composite stimulus signals, selected such that any output signal of the circuit can be decomposed into a linear combination of these signals. In other words, the set of composite stimulus signals provides a complete basis for describing any response of the circuit. The signal components have a one-to-one correspondence with the ports of the D.U.T., and are simultaneously applied to the ports. At least two of the signal components are non-zero.

Figure 2:
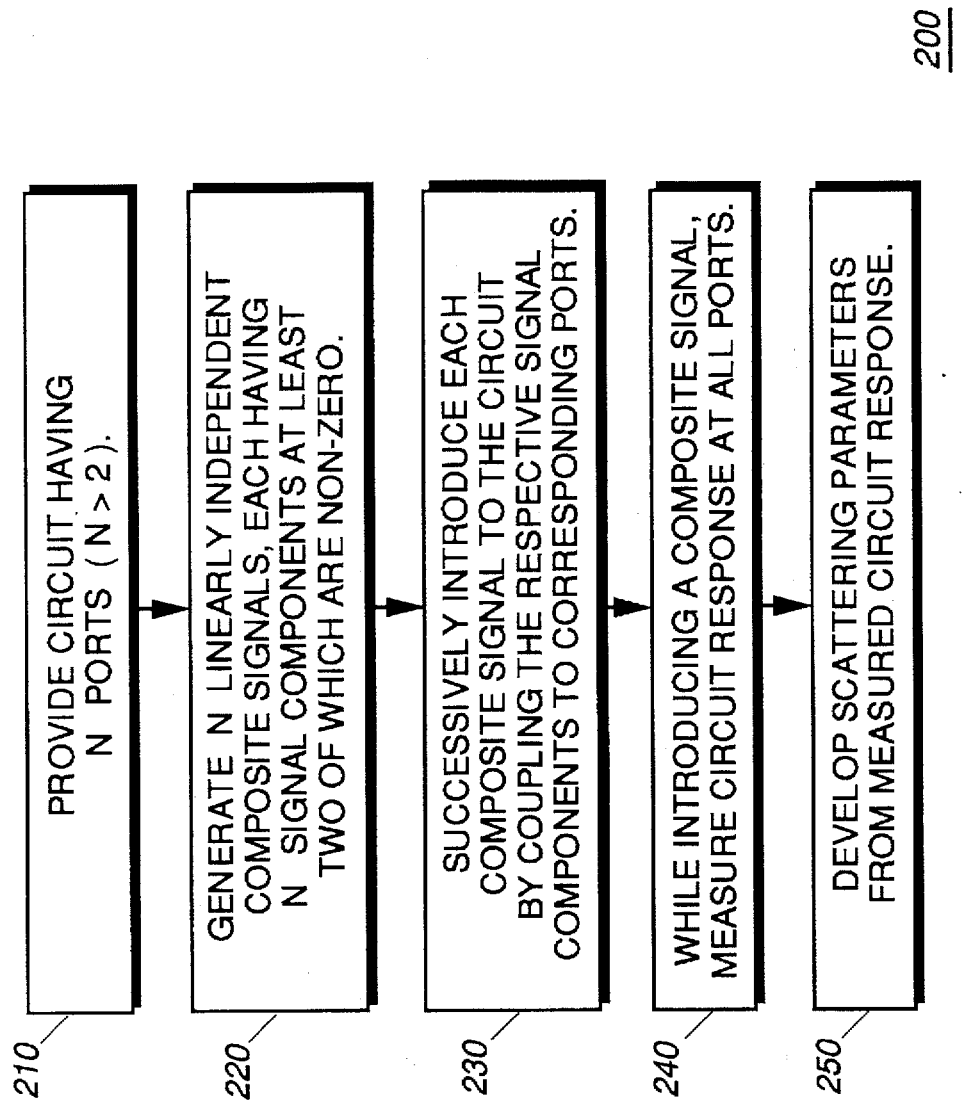
FIG. 2 is a flowchart of procedures for determining S-parameters that characterize a circuit, in accordance with the present invention.

FIG. 2 is a flowchart of procedures for determining characterizing S-parameters, in accordance with the present invention. A circuit is provided that has a number of ports N, where N is typically greater than two, step 210. A set of composite signals is generated for stimulating the circuit, step 220. The composite stimulus signals are linearly independent, and together provide a complete basis for describing any response of the circuit. Each composite stimulus signal is applied to the circuit as a set of signal components having a one-to-one correspondence with the ports of the circuits. At least two of these signal components are non-zero. Each composite stimulus signal is successively introduced to the circuit by coupling the respective signal components to corresponding circuit ports, step 230. While introducing a particular composite stimulus signal, the circuit response at each of the ports of the circuit is measured, step 240. The combination of measured circuit responses corresponding to each composite stimulus signal introduced is used to develop S-parameters, step 250.

Once S-parameters have been determined from a given set of composite stimulus signals, the circuit response may be fully characterized for different types of signal inputs by appropriate transformation of the derived S-parameters. For example, characterizing parameters can be determined for a circuit intended to process differential and common mode signals by using mixed-mode S-parameters. The matrix of mixed-mode S-parameters $[S_{mm}]$ can be related to standard S-parameters $[S]$ through the transformation:

$$[S_{mm}] = [M][S][M]^{-1};$$

where:

$$M = \frac{1}{\sqrt{2}} \begin{bmatrix} 1 & -1 & 0 & 0 \\ 0 & 0 & 1 & -1 \\ 1 & 1 & 0 & 0 \\ 0 & 0 & 1 & 1 \end{bmatrix}$$

Figure 3:
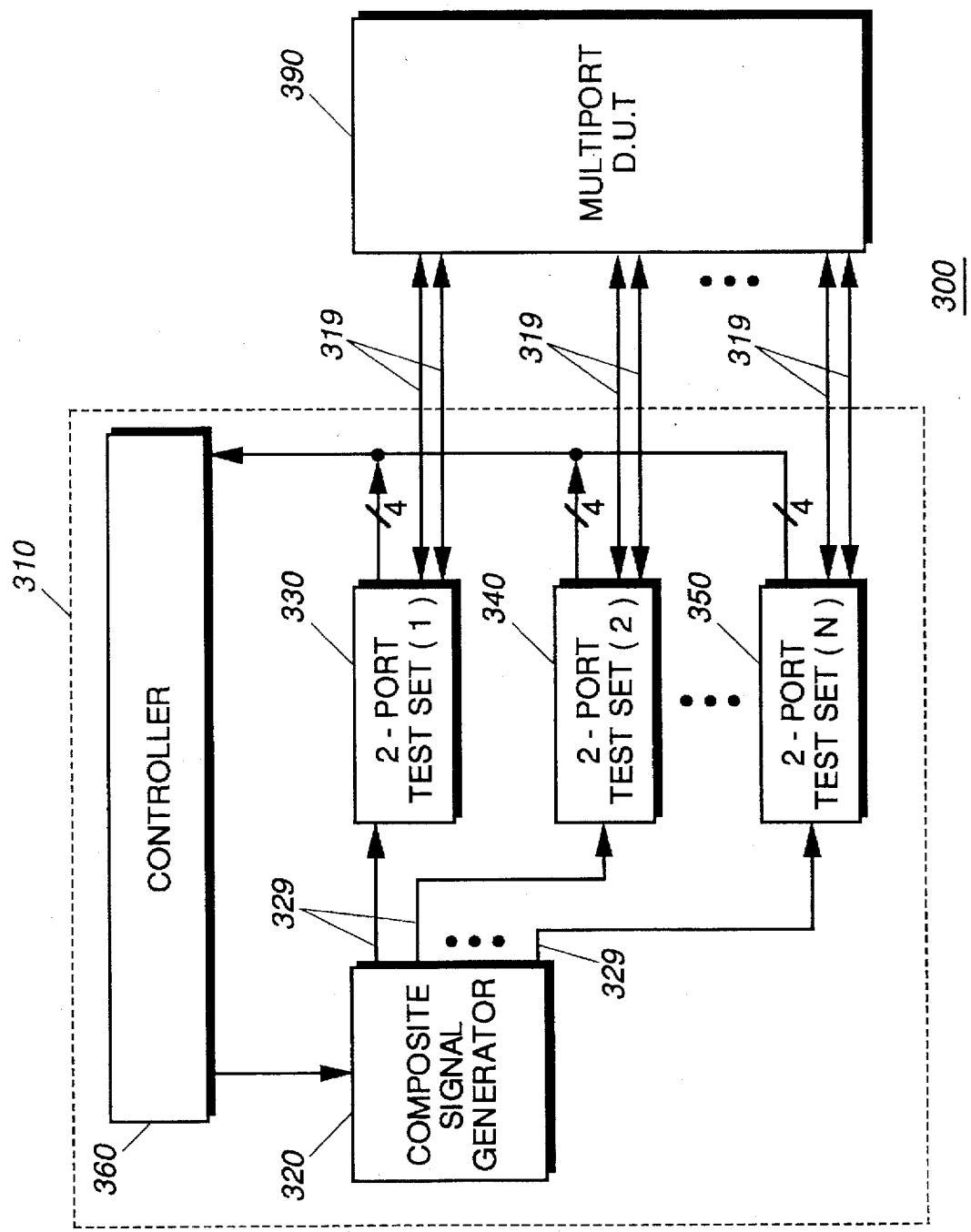
FIG. 3 is a block diagram of a multiport measurement system and coupled D.U.T., in accordance with the present invention.

Referring to FIG. 3, a circuit characterization environment 300 is shown, in accordance with the present invention. The circuit characterization environment 300 includes a multiport measurement system 310 which interfaces with a multiport D.U.T. 390. The measurement system 310 includes a composite signal generator 320 coupled to circuit interface apparatus which includes multiple two-port test sets 330, 340, 350. Each test set interfaces with the multiport D.U.T. 390, such as by coupling circuit interface ports on the test sets to corresponding ports on the D.U.T. A controller 360 provides operational control of the composite signal generator 320 and the two-port test sets 330, 340, 350. The test sets provide measurement data for stimulus signals injected into the D.U.T., and for corresponding output signals from the D.U.T. As many test sets are included as needed to provide the requisite interface ports to the D.U.T. Although two-port test sets are shown, the concepts of the present invention are applicable to use of test sets having different number of ports.

The composite signal generator 320 has an output 329 selectable from a set of composite signals that are linearly independent. The set of composite signals comprise a set of non-zero signals having a one-to-one correspondence with the multiple test sets. These non-zero signals are used to derive composite stimulus signals which are presented to the D.U.T. via circuit interface ports on the test sets. In combination, the test sets provide a vector of signal components or set of circuit stimulus signals 319 that includes at least two non-zero signals that are simultaneously presented at the D.U.T.

Figure 4:
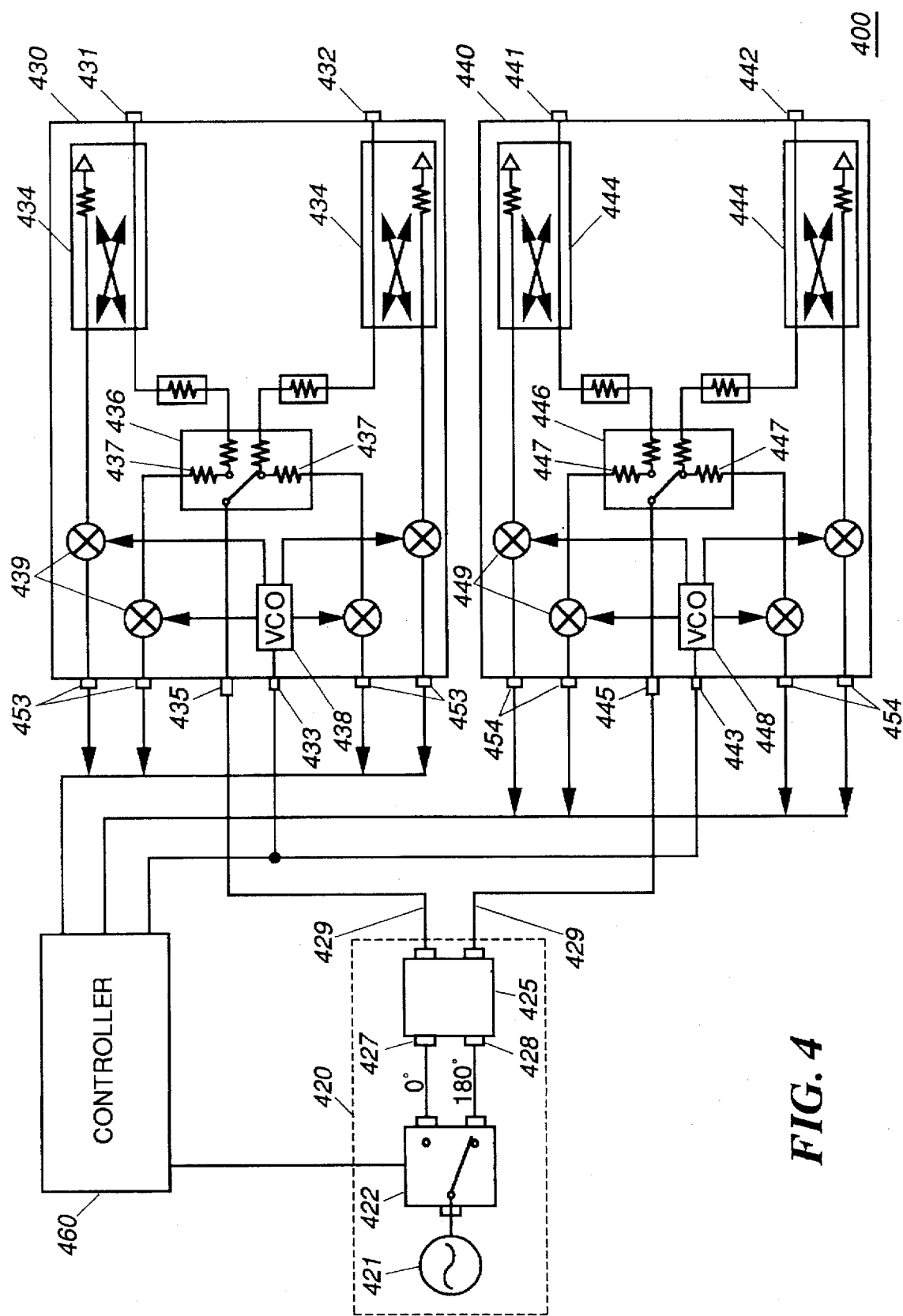
FIG. 4 is a simplified diagram of a four-port measurement system, in accordance with the present invention.

FIG. 4 is a simplified circuit diagram of a four-port measurement system 400, in accordance with the present invention. The four-port measurement system 400 is a special case of the N-port measurement system 310 of FIG. 3. In this configuration, a signal generator 420 is coupled to two two-port test sets 430, 440, which form the circuit interface apparatus. As before, the signal generator 420 and test sets 430, 440 are coupled to a controller 460, which provides operational control of the measurement system 400. In the preferred embodiment, each test set 430, 440 is implemented using a HP 8517A model test set, available from the Hewlett Packard company.

Each test set 430, 440 includes circuit interface ports or test ports 431, 432, 441, 442 that provide an interface to a D.U.T. The circuit interface ports 431, 432, 441, 442 are input/output ports which support stimulus signals for injection into the D.U.T., and allows return signals, such as may be reflected or transmitted from the D.U.T., to enter into a test set. Each test set further includes a signal input port 435, 445 that provides a source for signals to be outputted at the circuit interface ports 431, 432, 441, 442. An RF port switch 436, 446 connects a RF input signal to one of the test ports 431, 432, 441, 442. Control ports 433, 443 support coupling to the controller 460. Measurement circuitry includes directional couplers 434, 444, coupled to the circuit interface ports, that separate return signals from the stimulus signals. The separated return signals are measured to provide a circuit response measurement. Signal splitters 437, 447 coupled to the stimulus signals split off a portion of the stimulus signals, which is measured and provided as a reference for the return signals. Down mixers 439, 449 provide frequency translation, using a voltage-controlled oscillator, for the stimulus and return signals. The measurement for the return and stimulus signals are presented at measurement output ports 453, 454 for coupling to the controller 460.

The signal generator 420 of the preferred embodiment includes a signal source 421, a signal switch 422, and a 3 dB hybrid signal splitter 425. With this combination of components, the signal generator 420 generates composite signals that are linearly independent, and which have non-zero signal components. When in a first operation mode, the signal source is coupled to the input 427 of a zero degree (0°) signal splitter to provide two output component signals 429 having substantially equal amplitude and substantially equal phase. When in a second operation mode, the signal source 421 is switched to the input 428 of a 180° splitter, such that the signal generator 420 outputs signal components 429 of substantially equal amplitude, but having a phase difference of substantially 180°.

The two test sets processes each composite signal and present at the circuit interface ports 431, 432, 441, 442 of the test sets, a signal vector having at least two non-zero components. In other words, non-zero signals are outputted by at least two of the four ports. This is preferably accomplished by switching the test sets such that the signal from the signal generator coupled at the RF signal input port 435, 445 is directed to one port 431, 441 or the other 432, 442. The output signals at the circuit interface ports of the test sets provide a set of circuit stimulus signals, which can be represented as a signal vector having at least two non-zero signal components. The composite signals are selected such that the combinations of signal vectors presented at the ports of the test sets provide a complete basis for describing any response of the circuit to be tested.

Figure 5:
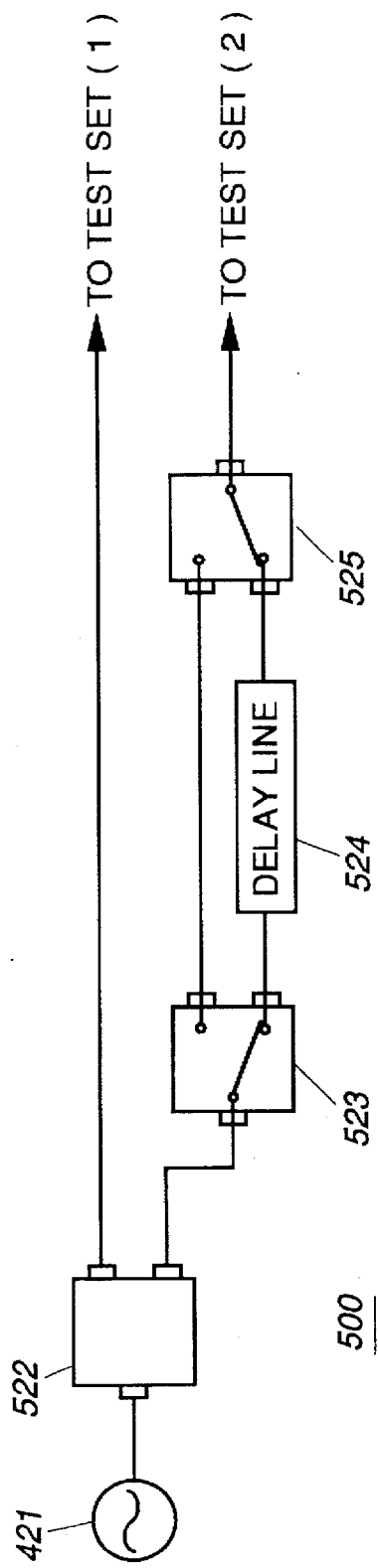
FIG. 5 is a first alternative embodiment of a signal generator, in accordance with the present invention.

FIG. 5 shows a second embodiment signal generator 500 in accordance with the present invention. The signal generator 500 includes a resistive splitter 522 coupled to a signal source 421. The resistor splitter 522 has two outputs, and one of the outputs is selectively coupled, via two complementary switches 523, 525, to a delay line 524. The effect of the delay line 524 is to induce a phase difference among the signal components of a particular composite signal. This approach has the advantage of low loss in the signal generation circuitry.

Figure 6:
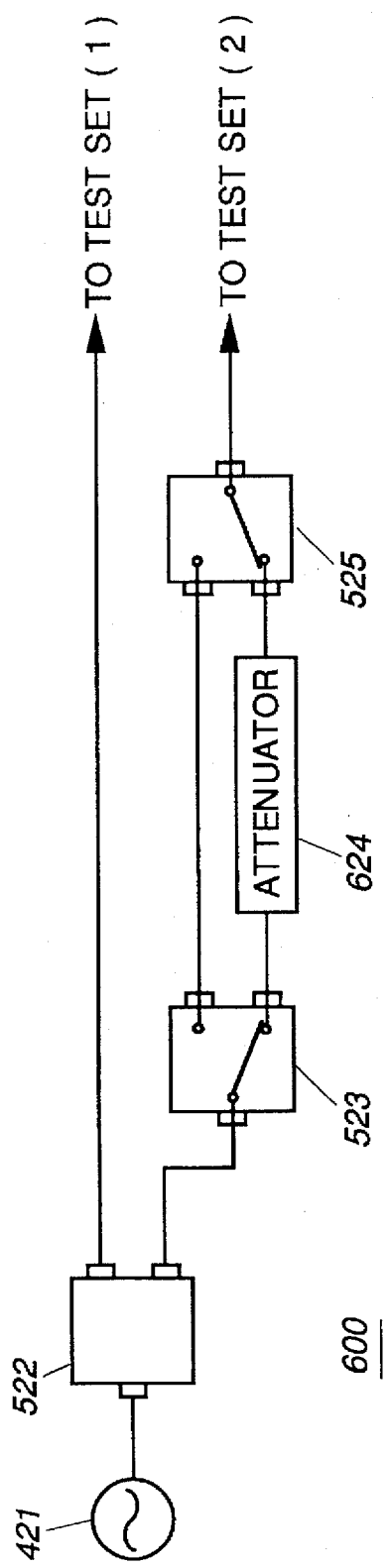
FIG. 6 is a second alternative embodiment of a signal generator, in accordance with the present invention.

FIG. 6 shows a third embodiment signal generator 600, in accordance with the present invention. Here, the signal generator 600 includes a resistive splitter 522 coupled to the signal source 421 as in FIG. 5. One output of the resistive splitter is selectively coupled, via two complementary switches 523, 525, to an attenuator 624 to change the amplitude of a signal component for one of the composite signals. This approach is particularly useful for broad band applications.

Referring back to FIG. 4, one possible operation sequence for the four-port measurement system of the present invention is described. The system is used to measure the responses of a circuit by successively applying composite stimulus signals via the test sets to the circuit, and by measuring corresponding circuit responses. The signal components of a composite stimulus signal may be represented by a vector having elements with a value of 0, 1, or −1, where 0 indicates that a signal is substantially absent at a particular port, 1 indicates a non-zero signal component, and −1 indicates a second non-zero signal components having a 180° phase difference. The vector is referenced herein as [P1 P2 P3 P4], where P1 represents the signal presented at port 442; P2, the signal at port 432; P3, the signal at port 441; and P4, the signal at port 431; and P1, P2, P3, P4 are vector element values as described above.

To apply the first composite stimulus signal, the signal generator is switched such that output signals having equal amplitude and phase are applied to each of the test sets simultaneously. The test sets are configured or switched to present a composite circuit stimulus signal or signal vector [0 1 0 1] at their respective interface ports P1, P2, P3, P4. Next the test sets are switched such that the ports of the circuit now see the composite signal vector [1 0 1 0]. The signal generator is then switched such that the signals generated have equal amplitude but have a phase difference of 180 degrees. The test sets are switched to output the signal vector [0 1 0 −1], and circuit response measurements taken. Next the test sets are switched to output the signal vector [1 0 −1 0], and the circuit response measurements taken. The set of input signal vectors, $$\begin{bmatrix} 0 \\ 1 \\ 0 \\ 1 \end{bmatrix} \begin{bmatrix} 1 \\ 0 \\ 1 \\ 0 \end{bmatrix} \begin{bmatrix} 0 \\ 1 \\ 0 \\ -1 \end{bmatrix} \begin{bmatrix} 1 \\ 0 \\ -1 \\ 0 \end{bmatrix}$$

form a complete basis to develop a matrix of S-parameters [S] that describe any response of the circuit. Thus, $$[S]=[B][A]^{-1};$$

where [B] is the set of measured circuit responses, and [A] is the input signal vectors.

The present invention offers significant advantages over the prior art. By combining readily available components, such as two-port test sets, in a manner described by the invention, a measurement system is formed that may be applied to measure and characterize multiport circuits. Using the approach taught by the invention, additional test sets may be added in order to provide sufficient ports to accurately characterize circuits having several ports. Thus, the expense associated with developing complicated test sets for applications involving four or more ports is obviated. Use of the apparatus and methods described by the present invention facilitates circuit design and development.

What is claimed is:

1. An apparatus for characterizing a circuit having at least three ports coupled thereto, comprising:

a signal generator; and a circuit interface apparatus coupled to the signal generator and having an output of a set of at least three circuit stimulus signals, which set of at least three circuit stimulus signals are linearly independent, and wherein each of the at least three circuit stimulus signals has a plurality of signal components having a one-to-one correspondence with the at least three ports of the circuit, and wherein at least two of the plurality of signal components for each of the at least three circuit stimulus signals are simultaneously non-zero.

2. The apparatus of claim 1, wherein:

the circuit interface apparatus comprises a plurality of test sets each comprising a signal input port, and at least one circuit interface port;

the signal generator has a plurality of outputs corresponding in number to the plurality of test sets; and the plurality of test sets are each coupled, in a one-to-one correspondence, to non-zero signal components at the plurality of outputs of the signal generator, which non-zero signal components constitute a particular composite signal.

3. The apparatus of claim 1, wherein the circuit interface apparatus comprises a plurality of two-port test sets.

4. The apparatus of claim 1, wherein the signal generator comprises a signal source, and a hybrid signal splitter coupled to the signal source.

5. The apparatus of claim 1, wherein the signal generator comprises a signal source, and a resistive splitter coupled to the signal source, the resistive splitter having two outputs, wherein at least one of the two outputs is selectively coupled to a delay line.

6. The apparatus of claim 1, wherein the signal generator comprises a signal source, and a resistive splitter coupled to the signal source, the resistive splitter having two outputs, wherein at least one of the two outputs is selectively coupled to an attenuator.

7. An apparatus for characterizing a multiport circuit, comprising:

a signal generator having an output selectable from among a plurality of composite signals that are linearly independent, wherein each composite signal comprises a plurality of non-zero signals; and first and second test sets coupled in a one-to-one correspondence with each of the plurality of non-zero signals, wherein the first and second test sets, in combination, provide at least three circuit interface ports that together output a plurality of circuit stimulus signals derived from the plurality of composite signals, which plurality of circuit stimulus signals are linearly independent, wherein each of the plurality of circuit stimulus signals has a non-zero signal component simultaneously present at at least two of the at least three circuit interface ports.

8. The apparatus of claim 7, wherein each test set comprises two circuit interface ports.

9. The apparatus of claim 7, wherein the signal generator comprises a signal source, and a hybrid signal splitter coupled to the signal source.

10. The apparatus of claim 7, wherein the signal generator comprises a signal source and a splitter coupled to the signal source, the splitter having two outputs, wherein at least one of the two outputs is selectively coupled to a delay line.

11. The apparatus of claim 7, wherein the signal generator comprises a signal source and a splitter coupled to the signal source, the splitter having two outputs, wherein at least one of the two outputs is selectively coupled to an attenuator.

12. An apparatus for characterizing a multiport circuit coupled thereto, comprising:

first and second two-port test sets each comprising:
a signal input port;
first and second circuit interface ports;
measurement ports coupled to the signal input port, and being operable to measure signals injected into the circuit through the first and second circuit interface ports; and
measurement ports coupled to the first and second circuit interface ports, and being operable to measure output signals from the multiport circuit; and a signal generator coupled to the first and second two-port test sets, the signal generator having first and second mode of operation, each mode of operation providing first and second signals to the signal input port of the first and second two-port test sets, respectively, wherein the first and second signals are non-zero, and wherein the first and second signals in combination are linearly independent between each of the first and second mode of operation.

13. The apparatus of claim 12, wherein the signal generator comprises a signal source and a hybrid signal splitter coupled to the signal source.

14. The apparatus of claim 12, wherein the first mode of operation provides first and second signals having substantially equal phase, and the second mode of operation provides first and second signals having a phase difference of substantially 180 degrees.

15. The apparatus of claim 12, wherein the signal generator comprises a signal source and a splitter coupled to the signal source, the splitter having two outputs, wherein at least one of the two outputs is coupled to a delay line.

16. The apparatus of claim 12, wherein the signal generator comprises a signal source and a splitter coupled to the signal source, the splitter having two outputs, wherein at least one of the two outputs is coupled to an attenuator.

17. A method of characterizing a circuit having at least three ports, comprising the steps of:

providing a plurality of composite signals that are linearly independent, and that together provide a complete basis for describing any response of the circuit, wherein each composite signal comprises a plurality of signal components having a one-to-one correspondence with the at least three ports, and wherein at least two of the plurality of signal components are non-zero; and introducing each of the plurality of composite signals into the plurality of ports of the circuit, and while introducing a particular composite signal, measuring circuit response at each of the plurality of ports.

18. The method of claim 17, wherein the plurality of composite signals comprises a first composite signal having a first amplitude and a first phase, and a second composite signal having a second amplitude substantially equal to the first amplitude, and a second phase having a phase difference of substantially 180 degrees.

19. The method of claim 17, further comprising the step of determining, from the measured circuit response, scattering parameters that characterize the circuit.

20. A method of characterizing a circuit having a plurality of ports, comprising the steps of:

providing a plurality of composite signals that are linearly independent, and that together provide a complete basis for describing any response of the circuit, wherein each composite signal comprises a plurality of signal components having a one-to-one correspondence with the plurality of ports, and wherein at least two of the plurality of signal components are non-zero;

introducing each of the plurality of composite signals into the plurality of ports of the circuit, and while introducing a particular composite signal, measuring circuit response at each of the plurality of ports;

determining common-mode scattering parameters from the measured circuit response;

determining differential-mode scattering parameters from the measured circuit response; and determining cross-mode scattering parameters from the measured circuit response.

* * * * *